(12) United States Patent
Nefzi et al.

(10) Patent No.: US 11,415,895 B2
(45) Date of Patent: Aug. 16, 2022

(54) COMPENSATION OF CREEP EFFECTS IN AN IMAGING DEVICE

(71) Applicant: Carl Zeiss SMT GmbH, Oberkochen (DE)

(72) Inventors: Marwène Nefzi, Ulm (DE); Ralf Zweering, Aalen (DE); Toralf Gruner, Aalen-Hofen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 0 days.

(21) Appl. No.: 17/354,160

(22) Filed: Jun. 22, 2021

(65) Prior Publication Data

US 2021/0405542 A1    Dec. 30, 2021

(30) Foreign Application Priority Data

Jun. 29, 2020  (DE) .......................... 102020208010.0

(51) Int. Cl.
*G03F 7/20*           (2006.01)

(52) U.S. Cl.
CPC ...... *G03F 7/70258* (2013.01); *G03F 7/70033* (2013.01); *G03F 7/70525* (2013.01); *G03F 7/70825* (2013.01)

(58) Field of Classification Search
CPC ............. G03F 7/70375; G03F 7/70033; G03F 7/70725; G03F 7/7085; G03F 7/70525;
(Continued)

(56) References Cited

U.S. PATENT DOCUMENTS

| 6,036,162 A | 3/2000 | Hayashi |
| 10,386,732 B2 | 8/2019 | Marsollek |

(Continued)

FOREIGN PATENT DOCUMENTS

| DE | 10 2008 032 853 A1 | 1/2010 |
| DE | 10 2016 208 008 A1 | 11/2017 |

(Continued)

OTHER PUBLICATIONS

U.S. Appl. No. 17/354,116, filed Jun. 22, 2021, Eylem Bektas Knauf.

(Continued)

*Primary Examiner* — Christina A Riddle
(74) *Attorney, Agent, or Firm* — Fish & Richardson P.C.

(57) ABSTRACT

An arrangement of a microlithographic optical imaging device includes first and second supporting structures. The first supporting structure supports at least one optical element of the imaging device via an active relative situation control device of a control device. The first supporting structure supports the second supporting structure via supporting spring devices of a vibration decoupling device. The supporting spring devices act kinematically parallel to one another. Each supporting spring device defines a supporting force direction and a supporting length along the supporting force direction. The second supporting structure supports a measuring device of the control device. The measuring device is connected to the relative situation control device. The measuring device outputs to the relative situation control device measurement information representative for the position and/or the orientation of the at least one optical element in relation to a reference in at least one degree of freedom in space.

20 Claims, 3 Drawing Sheets

(58) Field of Classification Search
CPC ............ G03F 7/70825; G03F 7/70258; G03F 7/70483–70541; G03F 7/70758; G03F 7/70775; G03F 7/708; G03F 7/70808; G03F 7/70816; G03F 7/70833; G03F 7/70858; G03F 7/70883; G03F 7/709; G03F 7/70975; G03F 7/70991
USPC .... 355/30, 39, 52–55, 66–77; 430/5, 22, 30, 430/269
See application file for complete search history.

(56) References Cited

U.S. PATENT DOCUMENTS

| | | | |
|---|---|---|---|
| 2005/0105069 A1 | 5/2005 | Loopstra et al. | |
| 2008/0240501 A1 | 10/2008 | Van Der Wijst et al. | |
| 2010/0124724 A1* | 5/2010 | Hoshino | G03F 7/70516 356/614 |
| 2010/0134770 A1* | 6/2010 | Okamoto | G03B 27/52 355/77 |
| 2011/0170078 A1 | 7/2011 | Loopstra et al. | |
| 2011/0299053 A1 | 12/2011 | Steinbach et al. | |
| 2017/0329238 A1 | 11/2017 | Schoenhoff et al. | |
| 2020/0124991 A1 | 4/2020 | Butler | |

FOREIGN PATENT DOCUMENTS

| | | |
|---|---|---|
| DE | 10 2017 207 433 A1 | 4/2018 |
| DE | 10 2018 200 528 A1 | 12/2018 |
| WO | WO 2018/015079 A1 | 1/2018 |
| WO | WO 2018/141520 A1 | 8/2018 |
| WO | WO 2018/192759 A1 | 10/2018 |

OTHER PUBLICATIONS

U.S. Appl. No. 17/354,204, filed Jun. 22, 2021, Marwene Nefzi.
U.S. Appl. No. 17/354,212, filed Jun. 22, 2021, Eylem Bektas Knauf.
German Office Action, with translation thereof, for corresponding DE Appl No. 10 2020 208 010.0, dated Jan. 26, 2021.
European Search Report for corresponding EP Appl No. 21 18 1975, dated Dec. 3, 2021.

* cited by examiner

COMPENSATION OF CREEP EFFECTS IN AN IMAGING DEVICE

CROSS-REFERENCE TO RELATED APPLICATIONS

This application claims priority under 35 U.S.C. § 119 to German patent application No. 10 2020 208 010.0, filed Jun. 29, 2020, the entire contents of which is incorporated by reference herein.

FIELD

The present disclosure relates to a microlithographic optical arrangement suitable for utilizing UV used light, such as light in the extreme ultraviolet (EUV) range. Furthermore, the disclosure relates to an optical imaging device including such an arrangement. The disclosure can be used in conjunction with any desired optical imaging methods, such as in the production or the inspection of microelectronic circuits and the optical components used for that purpose (for example optical masks).

BACKGROUND

The optical devices used in conjunction with the production of microelectronic circuits typically include a plurality of optical element units including one or more optical elements, such as lens elements, mirrors or optical gratings, which are arranged in the imaging light path. The optical elements typically cooperate in an imaging process in order to transfer an image of an object (for example a pattern formed on a mask) to a substrate (for example a so-called wafer). The optical elements are typically combined in one or more functional groups held, if appropriate, in separate imaging units. In the case of principally refractive systems that operate with a wavelength in the so-called vacuum ultraviolet range (VUV, for example at a wavelength of 193 nm), such imaging units are often formed from a stack of optical modules holding one or more optical elements. The optical modules typically include a supporting structure having a substantially ring-shaped outer supporting unit, which supports one or more optical element holders, the latter in turn holding the optical element.

The ever-advancing miniaturization of semiconductor components generally results in a constant demand for increased resolution of the optical systems used for their production. This demand for increased resolution can cause a demand for an increased numerical aperture (NA) and an increased imaging accuracy of the optical systems.

One approach for obtaining an increased optical resolution involves reducing the wavelength of the light used in the imaging process. The trend in recent years has increasingly fostered the development of systems in which light in the so-called extreme ultraviolet (EUV) range is used, typically at wavelengths of 5 nm to 20 nm, in most cases at a wavelength of approximately 13 nm. In this EUV range it is generally no longer possible to use conventional refractive optical systems. This is owing to the fact that in this EUV range the materials used for refractive optical systems generally have an absorbance that is too high to achieve acceptable imaging results with the available light power. Consequently, in this EUV range it is generally desirable to use reflective optical systems for the imaging.

This transition to purely reflective optical systems having a high numerical aperture (e.g. NA>0.4) in the EUV range can present challenges with regard to the design of the imaging device.

The factors mentioned above can result in very stringent desired properties with regard to the position and/or orientation of the optical elements participating in the imaging relative to one another and also with regard to the deformation of the individual optical elements in order to achieve a desired imaging accuracy. Moreover, it is generally desirable to maintain this high imaging accuracy over operation in its entirety, ultimately over the lifetime of the system.

As a consequence, it is desirable for the components of the optical imaging device (i.e., for example, the optical elements of the illumination device, the mask, the optical elements of the projection device and the substrate) which cooperate during the imaging to be supported in a well-defined manner in order to maintain a predetermined well-defined spatial relationship between these components and to obtain a minimal undesired deformation of these components in order ultimately to achieve the highest possible imaging quality.

A challenge in this case often relates to undertaking the most precise possible measurement of the relative situation (i.e., the position and/or orientation) of the optical components (e.g., the optical elements) involved in the imaging and actively setting the relative situation of at least some of these optical elements by way of an appropriately controlled relative situation control device with the precision (typically in the region of 1 nm or less) and control bandwidth (typically up to 200 Hz) used for the imaging process. In this case, a factor for the precision of the measurement is the stable and precise support of the measuring device used for the measurement. Where possible, it is desirable for this support to ensure that the components of the measuring device have a well-defined relative situation (i.e., position and/or orientation) in relation to a defined reference to which the measurement result of the measuring device is related.

An option frequently used in this context is that of supporting the measuring device on a separate supporting structure, which is often also referred to as "metrology frame" or "sensor frame". In this case, such a metrology frame is typically supported on a further (single-part or multi-part) load-bearing structure (often referred to as "force frame") which, in addition to the metrology frame, also supports at least some of the optical components (e.g., at least some of the optical elements) of the imaging device by way of the relative situation control device. This can ensure that the metrology frame can be kept largely clear from the support loads for the optical components.

To keep the metrology frame relatively free as possible from internal disturbances of the imaging device (e.g., vibrations induced by moving components) and external disturbances (e.g., unwanted shocks), the metrology frame is frequently supported on the load-bearing structure in vibration-isolated or vibration-decoupled fashion by way of a vibration decoupling device. Typically, this is implemented by way of a plurality of supporting spring devices of the vibration decoupling device.

While this can achieve good dynamic vibration isolation of the metrology frame (on short time scales), it was found, however, that, over long time scales, so-called creep effects or settling effects can arise in the area of the vibration decoupling device, for example in the area of the supporting spring devices. As a result of this, relative to the load-bearing structure, in the long term, there can be a change in the relative situation of the metrology frame and hence a change in the relative situation of the reference used for controlling the relative situation control device. However, creep or settling effects can also occur in any other type of support concepts without such vibration decoupling devices or supporting spring devices. Such a change in relative situation of the reference is typically compensated for by the relative situation control device during operation; however, it is desired that the latter provides sufficient travel to this end, and consequently a sufficient motion reserve, and accordingly has a correspondingly complicated or expensive design.

SUMMARY

Therefore, the disclosure is based on the object of providing a microlithographic optical arrangement and a corresponding optical imaging device including such an arrangement, and a corresponding method, which reduce, and possibly avoid, limitations of known technology, for example, facilitate optical imaging with the highest possible imaging quality in the simplest and most cost-effective manner.

The disclosure involves the technical teaching of being able to obtain optical imaging with a high imaging quality in a simple and cost-effective fashion if a change in the static relative situation between the load-bearing first supporting structure and the second supporting structure carrying the measuring device is detected in at least one degree of freedom, as it may occur, for example, as a result of creep processes in the area of the support of the second supporting structure. This change in static relative situation can then be compensated by virtue of setting, for the relative situation control device, a corrected target state of the position and/or orientation of the at least one optical element in relation to the reference on the basis of the captured change in relative situation. During the operation following this correction or compensation, this corrected target state can then be used in place of the previous target state.

Within the sense of the present disclosure, the term "change in static relative situation" should be understood to mean that this is the change in the relative situation or a drift between the first supporting structure and the second supporting structure, which is present in the purely static state, i.e., without dynamical excitation of the structures. As will still be explained in more detail below, such a change in static relative situation or drift can be detected by way of suitable methods which filter out short-term or dynamical influences. By way of example, there can be simple averaging of the relative situation information over suitably long periods of time.

In the case of conventional designs, there can be, depending on the extent of the change in static relative situation, a comparatively pronounced static (or non-dynamic) deflection of the relative situation control device and hence of the optical elements from their original initial relative situation may be provided, by which this change in relative situation is compensated for, hence the optical elements follow this change in relative situation. This can go so far that the relative situation control device is no longer able to provide the travel involved for the dynamic relative situation control of the optical elements during operation since it reaches its limits in this respect.

In conventional designs, this conflict is solved by virtue of the relative situation control device being designed with a correspondingly large room for maneuver, which allows it to react accordingly over the service life of the imaging device. However, this is linked to comparatively high costs since a displacement motion with correspondingly high dynamics, for example, can only be realized with comparatively great outlay. The part of the dynamic room for maneuver of the relative situation control device, by which the optical elements follow the change in static relative situation, is ultimately thus wasted from a cost point of view.

By contrast, using the present correction or compensation, it is easily possible to return the relative situation control device (and the optical elements carried thereby) back to its initial state (or in the vicinity thereof), as exhibited after an initial adjustment of the imaging device (typically immediately during first-time start-up of the imaging device), after a certain relatively long time of operation, over which the creep or settling effects have had a noticeable effect on the support of the second supporting structure. In this reset state, the relevant optical element then initially has a deviation with respect to its currently used target state (of the position and/or orientation) in relation to the reference of the second supporting structure. This reset state of the relevant optical element with respect to the reference can then easily be detected and used as new, corrected target state in place of the previously used target state. In this case, it is understood that the reference can be assigned to the second supporting structure in any suitable manner. For example, the reference can be a physical component of the second supporting structure. However, the reference can likewise also only be a virtual reference, which has a specified or defined relationship with the second supporting structure.

As a result, it is possible, for example, in a simple manner, to keep the maximum involved or possible travel of the relative situation control device relatively small or restrict it to the bare minimum. For example, there is no need to keep a large motion reserve for the compensation of long-term creep or settling effects. This motion reserve can be kept significantly smaller.

According to one aspect, the disclosure therefore relates to an arrangement of a microlithographic optical imaging device, for example for using light in the extreme UV (EUV) range, including a first supporting structure and a second supporting structure, wherein the first supporting structure is configured to support at least one optical element of the imaging device by way of an active relative situation control device of a control device. The first supporting structure supports the second supporting structure by way of a supporting device. The second supporting structure supports a measuring device of the control device, which measuring device is connected to the relative situation control device. The measuring device is configured to output to the relative situation control device measurement information which is representative for the position and/or orientation of the at least one optical element in relation to a reference, for example a reference of the second supporting structure, in at least one degree of freedom in space. The relative situation control device is configured to adjust, in a first mode of operation, on the basis of the measurement information, a first target state of the position and/or orientation of the at least one optical element in relation to the reference in the at least one degree of freedom. The control device is furthermore configured to detect relative situation change information which is representative for a change in a static relative situation between the first supporting structure and the second supporting structure in at least one degree of freedom. The control device has a compensation mode, in which, for compensating the change in relative situation, a corrected second target state of the position and/or orientation of the at least one optical element in relation to the reference is set for the relative situation control device on the basis of the relative situation change information. The control device is furthermore configured to use the second target state instead of the first target state in a second mode of operation that follows the compensation mode.

In general, the supporting device can have any design; for example, this can be an active (i.e., actively adjustable) or passive supporting device. Here, the first supporting structure can support the second supporting structure by way of a plurality of supporting units, for example, which act kinematically parallel to one another between the first supporting structure and the second supporting structure. In some embodiments, the first supporting structure supports the second supporting structure by way of a plurality of supporting spring devices of a vibration decoupling device, wherein the supporting spring devices act kinematically parallel to one another between the first supporting structure and the second supporting structure. In this case, each of the supporting spring devices defines a supporting force direction, along which it exerts a supporting force between the first supporting structure and the second supporting structure, and defines a supporting length along the supporting force direction. Here, the change in relative situation can be caused by a change in length of at least one of the supporting spring devices along their supporting force direction, which arises from a creep process of the supporting spring device. In this case, the compensation mode can then be referred to as the creep compensation mode.

In general, the corrected target state of the position and/or orientation of the at least one optical element with respect to the reference can be any suitable state which keeps the motion reserve of the relative situation control device that is to be maintained small, as desired. Here, other effects can also be taken into account, for example a change in the properties of the relative situation control device (e.g., as a result of ageing, creep effects or settling effects, etc.). This may cause a deviation of the corrected target state of the position and/or orientation of the at least one optical element in relation to the reference from the target state during the first-time start-up of the imaging device.

Optionally, the relative situation control device has an adjusted first initial state, in which the at least one optical element is in the first target state. Then, in the second mode of operation immediately following the creep compensation mode, the relative situation control device has a corrected second initial state, in which the at least one optical element is at least substantially in the second target state, wherein the second initial state at least substantially corresponds to the first initial state. In this way, the relative situation control device can thus easily be reset back into its initial state, in which it was prior to the onset of the creep or settling effects, in the manner described above. This can keep the motion reserve of the relative situation control device that is to be maintained relatively small, as desired.

It is understood that replacing the target state by a new, corrected target state can be carried out any desired number of times and that it is consequently possible to switch into the compensation mode as often as desired. By this approach, it is possible to obtain a correspondingly desirable operational behavior over the entire service life of the imaging device.

In general, the change in relative situation or the associated relative situation change information can be determined in any suitable manner. Optionally, the relative situation control device includes a deflection detection device, wherein the deflection detection device is configured to detect deflection information which is representative for a deflection of the at least one optical element in relation to the first supporting structure in at least one degree of freedom from the first initial state. The control device is then configured to derive the relative situation change information from the deflection information, for example on the basis of a change in the deflection information over time.

In some embodiments, the relative situation control device includes at least one relative situation control actuator, for example a plurality of relative situation control actuators, for actively adjusting the at least one optical element. A deflection detection device is then configured to detect adjustment information which is representative for an adjustment of the at least one relative situation control actuator from the first initial state. The control device is furthermore configured to derive the relative situation change information from the adjustment information, for example on the basis of a change in the adjustment information over time.

In general, the adjustment information can be detected in any suitable way. Thus, for example, provision can be made for the control signals for the at least one relative situation control actuator to be detected and stored without gaps in a history starting from the first initial state and for the adjustment information to be determined from this history of the control signals.

In embodiments that are desirable due to their comparatively simple and very reliable design, the deflection detection device can include at least one adjustment sensor which is assigned to the at least one relative situation control actuator. The adjustment sensor outputs adjustment sensor information which is representative for the positioning movement of the relative situation control actuator, for example, a change in length of the relative situation control actuator. Then, the control device is configured to derive the adjustment information from the adjustment sensor information. It is understood that, in general, any number of adjustment sensors can be provided per relative situation control actuator in order to determine the adjustment information. In some embodiments, at least two adjustment sensors are assigned to the at least one relative situation control actuator since this allows a relatively reliable, error-tolerant determination of the adjustment information.

In certain embodiments, the control device can use a state change model of the supporting device to ascertain the relative situation change information, wherein the state change model, for example, can be time-dependent (for example, in order to map ageing processes). In this case, the state change model describes an (for example time-dependent) relative situation change behavior of the supporting device. By way of example, the state change model can be the creep model of the supporting device, wherein the creep model of the supporting device describes the creep behavior of the supporting device. The relative situation change information can then be ascertained from this relative situation change behavior or creep behavior, which is known with sufficient accuracy, possibly without a further sensor system. In some embodiments, the state change model (e.g., the creep model) can also be used for checking the plausibility of the relative situation change information, which was determined in another way, such as described above or below.

In certain embodiments, the control device can optionally also include an imaging error detection device, wherein the imaging error detection device is configured to generate at least one imaging error information which is representative for an imaging error of the imaging device. The control device is then configured to derive the relative situation change information from the imaging error information, for example on the basis of a change in the imaging error information over time. These embodiments use a known relationship between the imaging error and the change in static relative situation caused by creep or settling effects. Thus, certain changes in relative situation can cause characteristic imaging errors, which consequently have a characteristic fingerprint, which was determined in advance from theory and/or by simulation. These characteristic imaging errors or fingerprints can then be used to deduce an actual change in relative situation during operation.

A relatively clear relationship between the imaging error and a change in relative situation arises, for example, in the case of embodiments in which the optical imaging device further includes passive optical components which are involved with the imaging but not actively adjusted by way of the relative situation control device, but instead are connected in a substantially rigid fashion to the first supporting structure during operation. By way of example, this can apply to individual optical elements or optical components such as stops or the like. In this case, only the actively adjusted optical components are repositioned by the relative situation control device to follow the change in relative situation while the passive components remain in their relative situation thus yielding a change in relative situation between the optical components which is accompanied by a characteristic imaging error.

In some embodiments, the control device can include a relative situation detection device, wherein the relative situation detection device is configured to generate at least one relative situation information item which is representative for the relative situation between the first supporting structure and the second supporting structure in at least one degree of freedom. The control device is then configured to derive the relative situation change information from the relative situation information, for example on the basis of a change in the relative situation information over time. In this way, it is possible to realize relatively simple and precise detection of the relative situation change information.

It should be mentioned at this point that the embodiments described above or below for determining the relative situation change information can be combined in any manner as a matter of principle, for example in order to obtain consolidated (e.g., averaged) relative situation change information. In addition or as an alternative thereto, it is naturally also possible to use individual embodiments for checking the plausibility of the results of the other embodiments.

In general, replacing the first target state by the second target state can be implemented at any suitable periods of time or triggered by any temporal events (e.g., specifiable intervals) and/or non-temporal events (e.g., detected shock loads, reaching a certain number of imaging procedures, starting up or shutting down the imaging device, etc.).

In certain embodiments, the control device is configured to activate the compensation mode if the relative situation change represented by the relative situation change information exceeds a specifiable limit value. As a result of this, it is naturally possible to react relatively efficiently and in needs-based fashion to the creep or settling effects.

Additionally or alternatively, as mentioned above, the control device can be configured to activate the compensation mode on the basis of specifiable events, for example at specifiable time intervals, wherein the compensation mode is activated, for example, 0.25 to 10 years (e.g., 0.5 to 5 years, 1 to 2 years) following first operation of the imaging device and/or a preceding activation of the compensation mode.

In general, the control device can be designed in any suitable manner in order to realize a control of the relative situation control device that is adapted to the respective optical imaging process. It is possible, for example, to provide any suitable control bandwidths for controlling the relative situation control device. In some embodiments, the control device has a control bandwidth of 10 Hz to 1000 Hz (e.g., 20 Hz to 500 Hz, 50 Hz to 300 Hz).

The degree of freedom or the degrees of freedom in which there is a change in relative situation which is relevant to the imaging process or the imaging errors thereof as a result of creep or settling effects can be any degrees of freedom, up to all six degrees of freedom in space. Here, any suitable limit values can be specified, which, if exceeded, involve or prompt a replacement of the previous target state by the corrected target state.

In certain embodiments, the at least one degree of freedom of the change in relative situation is a rotational degree of freedom, for example, a rotational degree of freedom about a tilt axis extending transversely to the direction of gravity. The specifiable limit value then can be representative for a deviation of the relative situation between the first supporting structure and the second supporting structure from a specifiable relative target situation by 1 μrad to 500 μrad (e.g., 10 μrad to 300 μrad, 20 μrad to 100 μrad). In addition or as an alternative thereto, the at least one degree of freedom of the change in relative situation can be a translational degree of freedom, for example, a translational degree of freedom along the direction of gravity. The specifiable limit value then can be representative for a deviation of the relative situation between the first supporting structure and the second supporting structure from a specifiable relative target situation by 1 μm to 500 μm (e.g., 10 μm to 300 μm, 20 μm to 100 μm).

The present disclosure also relates to an optical imaging device, for example for microlithography, including an illumination device including a first optical element group, an object device for receiving an object, a projection device including a second optical element group and an image device, wherein the illumination device is configured to illuminate the object and the projection device is configured to project an image of the object onto the image device. The illumination device and/or the projection device includes at least one arrangement according to the disclosure. This makes it possible to realize the embodiments and features described above to the same extent, and so reference is made to the explanations given above in this respect.

The disclosure furthermore relates to a method for a microlithographic optical imaging device, for example for using light in the extreme UV (EUV) range, wherein a first supporting structure supports a second supporting structure by way of a plurality of supporting spring devices of a vibration decoupling device. The first supporting structure supports at least one optical element of the imaging device by way of an active relative situation control device of a control device, wherein the supporting spring devices act kinematically parallel to one another between the first supporting structure and the second supporting structure. Each of the supporting spring devices defines a supporting force direction, along which it exerts a supporting force between the first supporting structure and the second supporting structure, and defines a supporting length along the supporting force direction. The second supporting structure supports a measuring device of the control device, which measuring device is connected to the relative situation control device. The measuring device outputs to the relative situation control device measurement information which is representative for the position and/or orientation of the at least one optical element in relation to a reference, for example, a reference of the second supporting structure, in at least one degree of freedom in space. The relative situation control device, in a first mode of operation, adjusts a first target state of the position and/or orientation of the at least one optical element in relation to the reference in the at least one degree of freedom on the basis of the measurement information. Relative situation change information which is representative for a change in a static relative situation between the first supporting structure and the second supporting structure in at least one degree of freedom is detected, wherein the change in relative situation, for example, is caused by a change in length of at least one of the supporting spring devices along their supporting force direction, which arises from a creep process of the supporting spring device. In a creep compensation mode, for compensating the change in relative situation, a corrected second target state of the position and/or orientation of the at least one optical element in relation to the reference is set for the relative situation control device on the basis of the relative situation change information. Then, the second target state is used instead of the first target state in a second mode of operation that follows the creep compensation mode. This makes it possible to realize the embodiments and features described above to the same extent, and so reference is made to the explanations given above in this respect.

Further aspects and exemplary embodiments of the disclosure are evident from the dependent claims and the following description of exemplary embodiments, which refers to the accompanying figures. All combinations of the disclosed features, irrespective of whether or not they are the subject of a claim, lie within the scope of protection of the disclosure.

DETAILED DESCRIPTION OF EXEMPLARY EMBODIMENTS

Figure 1:
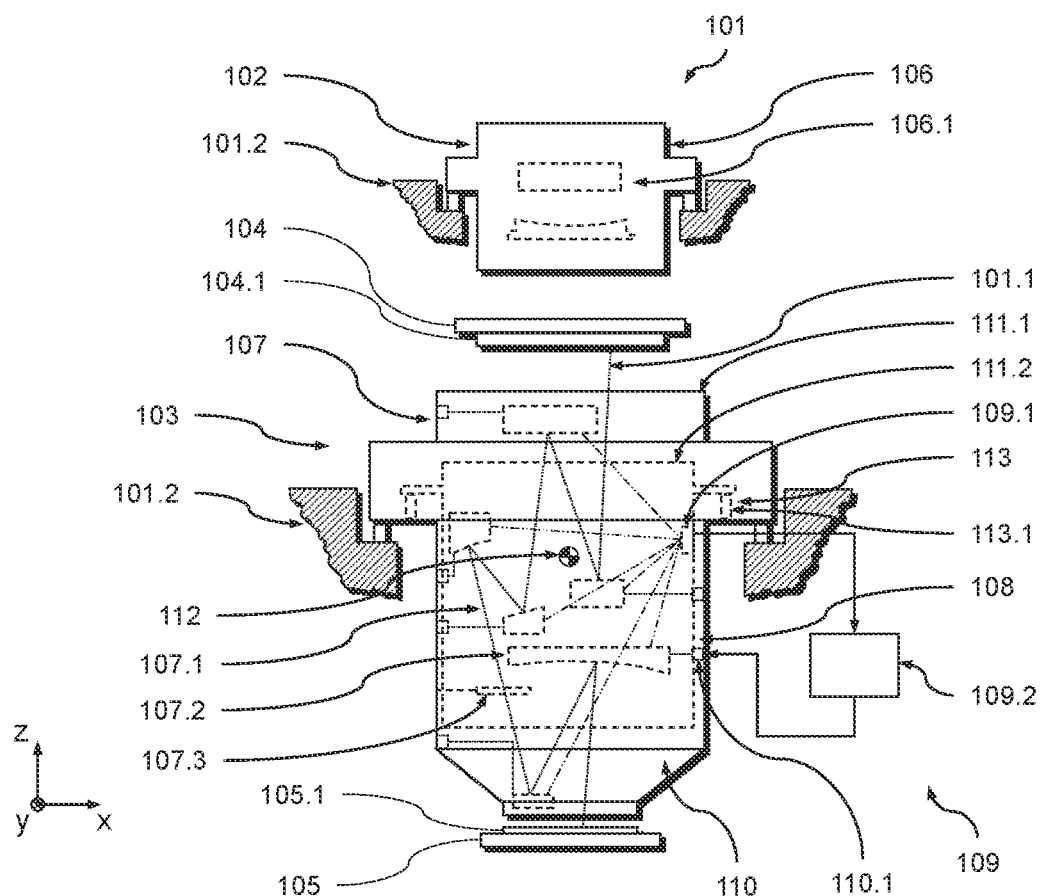
FIG. 1 is a schematic illustration of an embodiment of an optical imaging device according to the disclosure, which includes an embodiment of an optical arrangement according to the disclosure.

Exemplary embodiments of an optical imaging device according to the disclosure in the form of a microlithographic projection exposure apparatus 101, which include exemplary embodiments of an optical arrangement according to the disclosure, are described below with reference to FIGS. 1 to 5. To simplify the following explanations, an x, y, z coordinate system is indicated in the drawings, the z direction running counter to the direction of the gravitational force. It goes without saying that it is possible in further configurations to choose any desired other orientations of an x, y, z coordinate system.

FIG. 1 is a schematic, not-to-scale illustration of the projection exposure apparatus 101, which is used in a microlithographic process for producing semiconductor components. The projection exposure apparatus 101 includes an illumination device 102 and a projection device 103. The projection device 103 is designed to transfer, in an exposure process, an image of a structure of a mask 104.1, which is disposed in a mask unit 104, onto a substrate 105.1, which is disposed in a substrate unit 105. To that end, the illumination device 102 illuminates the mask 104.1 (by way of a light guiding device which is not illustrated here). The optical projection device 103 receives the light from the mask 104.1 and projects the image of the mask structure of the mask 104.1 onto the substrate 105.1, such as for example a wafer or the like.

The illumination device 102 includes an optical unit 106 with an optical element group 106.1. The projection device 103 includes a further optical unit 107 with an optical element group 107.1. The optical element groups 106.1, 107.1 are disposed along a folded central ray path 101.1 of the projection exposure apparatus 101. Each of the optical element groups 106.1, 107.1 can include any plurality of optical elements.

In the present exemplary embodiment, the projection exposure apparatus 101 operates with used light in the EUV range (extreme ultraviolet radiation), with wavelengths of between 5 nm and 20 nm, for example with a wavelength of 13.5 nm. The optical elements of the element groups 106.1, 107.1 of the illumination device 102 and the projection device 103 are therefore exclusively reflective optical elements. The optical element groups 106.1, 107.1 may include one or more optical arrangements according to the disclosure, as is described below with reference to the optical arrangement 108. The optical units 106 and 107 are each supported by way of a base structure 101.2.

In further configurations of the disclosure, it is also possible (for example depending on the wavelength of the illumination light), of course, to use any type of optical elements (refractive, reflective, diffractive) alone or in any desired combination for the optical modules.

The arrangement according to the disclosure is described in exemplary fashion below with reference to the arrangement 108, which is part of the projection device 103. With the imaging device 101 there are, inter alia, very strict desired properties with respect to the position and/or orientation of the optical elements of the optical element group 107.1 of the projection device 103 relative to one another in order to attain a desired imaging accuracy. Moreover, it is desirable to maintain this high imaging accuracy over operation in its entirety, ultimately over the lifetime of the system.

As a consequence, it is desirable for the optical elements of the optical element group 107.1 to be supported in a well-defined fashion in order to observe a specified well-defined spatial relationship between the optical elements of the element group 107.1 and the remaining optical components and in order thus to ultimately attain the highest possible imaging quality.

To this end, in the present example the relative situation (i.e., the position and/or orientation) of the optical elements of the element group 107.1 is measured with a measuring device 109.1 (illustrated only in much simplified fashion in FIG. 1) of a control device 109. The measuring device 109.1 feeds its measurement signals LMS to a control unit 109.2 of the control device 109. On the basis of the measurement signals LMS of the measuring device 109.1, the control unit 109.2 then controls a relative situation control device 110, which is supported on a load-bearing first structure 111.1. Then, by way of the relative situation control device 110, the relative situation of each of the optical elements of the element group 107.1 is actively set with respect to a central reference 112 with the precision (typically in the region of 1 nm) and the control bandwidth (typically up to 200 Hz) involved for the imaging process.

Figure 2:
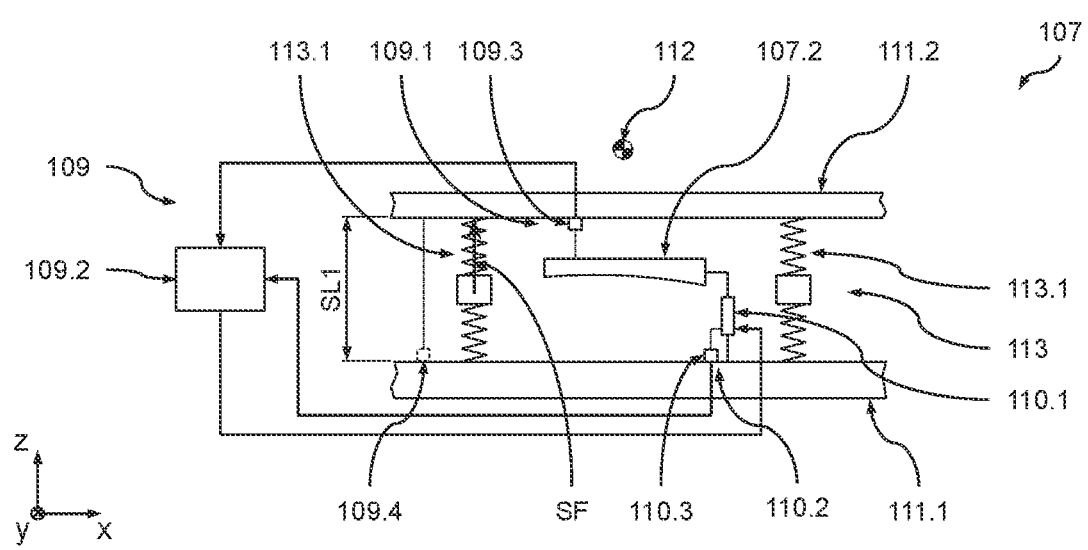
FIG. 2 is a schematic view of part of the imaging device from FIG. 1 in a first state.

In the present example, the measuring device 109.1 outputs to the relative situation control device 110 measurement information MI which is representative for the respective position and/or orientation of the respective optical element of the element group 107.1 in relation to the reference 112 in at least one degree of freedom in space. In the state of the first-time start-up of the imaging device 101 (in which the imaging device 101 is in a first operating state OM1), the control unit 109.2 consequently accordingly controls the relative situation control device 110 on the basis of the measurement information MI in order to generate a first target state S1 of the position and/or orientation of the optical elements of the element group 107.1 in relation to the reference 112, as illustrated in FIG. 2 for an optical element 107.2 of the element group 107.1.

A factor for the attainable imaging quality of the imaging device 101 is the precision of the measurement of the measuring device 109.1, which in turn depends on a support of the measuring device 109.1 that is as stable and precise as possible. Where possible, this support should ensure that the components of the measuring device 109.1 have a well-defined relative situation (i.e., position and/or orientation) in relation to the central reference 112 to which the measurement result of the measuring device 109.1 is related.

To this end, the measuring units 109.3 of the measuring device 109.1 are supported on a separate second supporting structure 111.2, which is frequently also referred to as a metrology frame. The metrology frame 111.2 in turn is supported on the (single-part or multi-part) load-bearing first structure 111.1. This can ensure that the metrology frame 111.2 can be kept largely clear from the support loads for the optical elements of the element group 107.1.

To keep the metrology frame 111.2 as largely free as possible from internal disturbances of the imaging device 101 (e.g., vibrations induced by moving components) and external disturbances (e.g., unwanted shocks), the metrology frame 111.2 is supported on the load-bearing structure 111.1 by way of a supporting device 113. In general, the supporting device 113 can be designed in any suitable way. In the present example, the supporting device is configured in the form of a vibration decoupling device 113, by which the metrology frame 111.2 is supported in vibration-isolated or vibration-decoupled fashion on the load-bearing structure 111.1. This is implemented by way of a plurality of supporting spring devices 113.1 of the vibration decoupling device 113, wherein the supporting spring devices 113.1 act kinematically parallel to one another between the load-bearing first supporting structure 111.1 and the metrology frame 111.2. Each of the supporting spring devices 113.1 defines a supporting force direction SFR (not illustrated in FIG. 2), along which it exerts a supporting force SF between the first supporting structure 111.1 and the second supporting structure 111.2, and defines a supporting length SL1 along the supporting force direction SFR.

Figure 3:
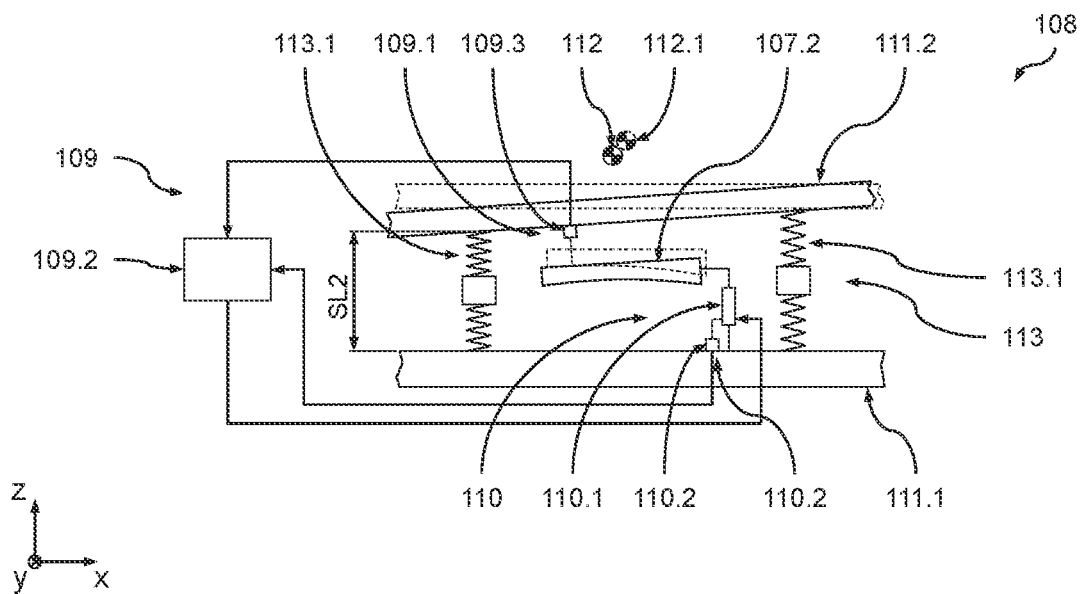
FIG. 3 is a schematic view of the part of the imaging device from FIG. 2 in a second state.
Figure 4:
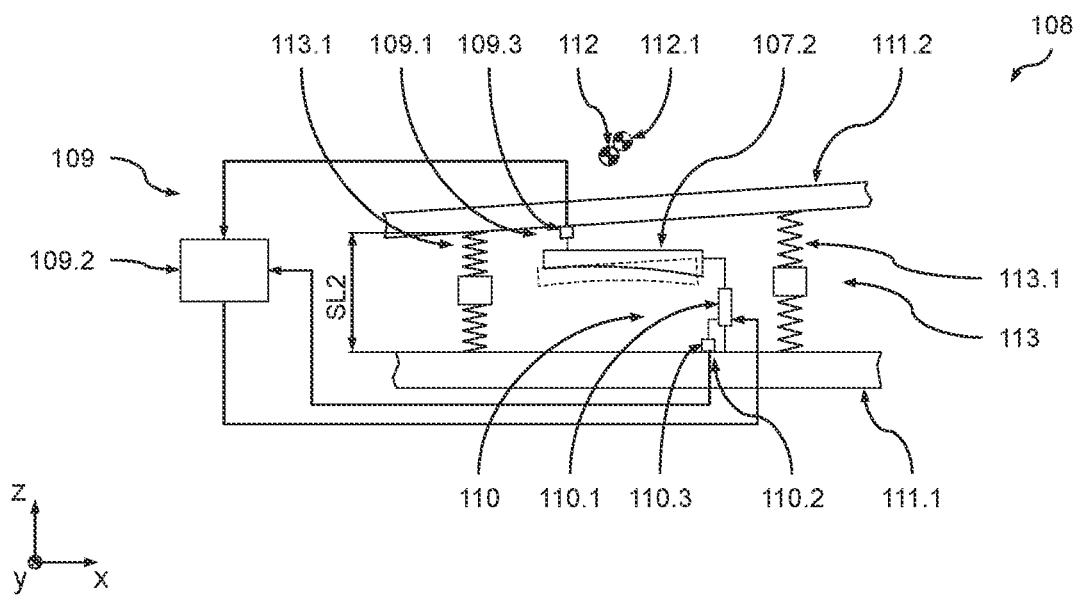
FIG. 4 is a schematic view of the part of the imaging device from FIG. 2 in a third state.

While this can achieve good dynamic vibration isolation or vibration decoupling of the metrology frame 111.2 from the load-bearing first supporting structure 111.1 (on short time scales), it was found, however, that, over long time scales, so-called creep effects or settling effects can arise in the area of the vibration decoupling device 113, for example in the area of the supporting spring devices 113.1. As a result of this, the supporting length of the supporting spring devices 113.1 changes in the long-term (as indicated in FIGS. 3 and 4 by the length SL2) and hence there is a change both in the relative situation of the metrology frame 111.2 and in the relative situation of the reference 112 used for controlling the relative situation control device 110 with respect to the load-bearing structure 111.1 (in relation to the initial relative situation indicated in FIG. 3 by the contour 112.1), as illustrated (in very much exaggerated fashion) in FIG. 3. In general, such a change in relative situation of the reference 112 can be compensated for by the relative situation control device 110 during normal operation of the imaging device 101 by virtue of the optical elements of the element group 107.1 of the reference 112 being adjusted (as illustrated in FIG. 3). However, such a compensation of the change in relative situation of the reference 112 by the relative situation control device 110 over the service life of the imaging device 101 would involve sufficient travel, hence a sufficient motion reserve of the relative situation control device 110, as a result of which the latter would have to have a correspondingly complicated or expensive design.

To avoid this, the control device 109 detects relative situation change information RSCI which is representative for a change in the static relative situation between the first supporting structure 110.1 and the second supporting structure 110.2 in at least one degree of freedom. The control device 109 has a compensation mode CCM (also referred to as creep compensation mode CCM below), in which, for compensating the change in relative situation, a corrected second target state S2 of the position and/or orientation of the optical element 107.2 in relation to the reference 112 is set for the relative situation control device 110 on the basis of the relative situation change information RSCI. The control device 109 then, in a second mode of operation OM2 which follows the compensation mode CCM, uses the second target state S2 instead of the first target state S1 for controlling the relative situation control device 110.

As illustrated in FIG. 4, this correction or compensation for example allows, in a simple manner, to return or reset the relative situation control device 110 (and the optical elements of the element group 107.1, for example the optical element 107.2, carried thereby), after a certain relatively long period of operation (over which the creep or settling effects have had a noticeable effect on the support of the second supporting structure 110.2), back to their initial state (or to the vicinity thereof), which they had following an initial adjustment of the imaging device (typically immediately during the first-time start-up of the imaging device 101), consequently which they had in the first operating state OM1.

In this reset state illustrated in FIG. 4, the optical element 107.2 then initially has a deviation with respect to its target state S1, currently used by the control unit 109.2, in relation to the reference 112. This reset state of the optical element 107.2 in relation to the reference 112 is detected by way of the measuring device 109.1 in the present example and is used by the control unit 109.2 in the second mode of operation OM2 (following the creep compensation mode CCM) as a new, corrected target state S2 instead of the previously used target state S1.

As a result, it is possible, for example in a simple manner, to keep the maximum involved or possible travel of the relative situation control device 110 relatively small or restrict it to the bare minimum. For example, there is no need to keep a large motion reserve for the compensation of long-term creep or settling effects by the relative situation control device 110. This motion reserve can be kept significantly smaller and, for example, be restricted to a value to be expected for the duration of the first mode of operation OM1.

It is understood that, in general, the corrected target state S2 of the position and/or orientation of the optical element 107.2 with respect to the reference 112 can in other embodiments be any suitable state which keeps the motion reserve to be maintained of the relative situation control device 110 small, as desired. Here, other effects can also be taken into account, for example a change in the properties of the relative situation control device 110 (e.g., as a result of ageing, creep effects or settling effects, etc.). This may, where applicable, also cause a deviation of the corrected target state S2 of the position and/or orientation of the optical element 107.2 in relation to the reference 112 from the first target state S1 during the first-time start-up of the imaging device 101.

As already explained above, the relative situation control device 110 in the present example has an adjusted first initial state in the first mode of operation OM1, in which the optical element 107.2 is in the first target state S1 (see FIG. 2). In the second mode of operation OM2 directly after the creep compensation mode CCM, the relative situation control device 110 then has a corrected second initial state, in which the optical element 107.2 is at least substantially in the second target state S2 (see FIG. 4). Here, this second initial state at least substantially corresponds to the first initial state.

In this way, the relative situation control device 110 can thus easily be reset back into its initial state, in which it was prior to the onset of the creep or settling effects, in the manner described above. This can keep the motion reserve to be maintained of the relative situation control device relatively small, as desired.

It is understood that the replacing of the target state S1 by a new, corrected target state S2 can be carried out any desired number of times and that it is consequently possible to switch into the creep compensation mode CCM as often as desired. Using this, it is possible to obtain a correspondingly desirable operational behavior over the entire service life of the imaging device 101.

In general, the change in relative situation or the associated relative situation change information RSCI can be determined in any suitable manner. In the present example, the relative situation control device 110 includes a deflection detection device 110.2 connected to the control unit 109.2. The deflection detection device 110.2 detects deflection information DI, which is representative for a deflection of the optical element 107.2 in relation to the first supporting structure 111.1 in at least one degree of freedom from the first initial state. The control device 109 then derives the relative situation change information RSCI from the deflection information DI, for example on the basis of a change in the deflection information DI over time.

In the present example, the relative situation control device 110 includes a number of relative situation control actuators 110.1 for actively adjusting the optical element 107.2, of which actuators only one relative situation control actuator 110.1 is respectively illustrated in FIGS. 2 to 4 for reasons of clarity. In typical embodiments, provision is made of a plurality of relative situation control actuators 110.1 which act between the first supporting structure 111.1 and the optical element 107.1 in the style of a parallel kinematic system. By way of example, provision can be made of six relative situation control actuators 110.1, which act in the manner of a hexapod kinematic system.

In the present example, a deflection detection device 110.2 detects adjustment information VI, which is representative for an adjustment of the respective relative situation control actuator 110.1 from the adjusted first initial state. The control device 109.1 then derives the relative situation change information RSCI from the adjustment information VI, for example on the basis of a change in the adjustment information VI over time.

In the present example, the deflection detection device 110.2 includes at least one adjustment sensor 110.3, which is assigned to the respective relative situation control actuator 110.1. The adjustment sensor 110.3 outputs adjustment sensor information VSI, which is representative for the positioning movement of the relative situation control actuator 110.1, for example a change in length of the relative situation control actuator 110.1. The control device 109 then derives the adjustment information VI from the adjustment sensor information VSI. It is understood that, in general, any number of adjustment sensors 110.3 can be provided per relative situation control actuator 110.1 in order to determine the adjustment information VI. In the present example, at least two adjustment sensors 110.3 are assigned to the respective relative situation control actuator 110.1 since this allows a relatively reliable, error-tolerant determination of the adjustment information VI.

However, it is understood that the adjustment information VI can in general also be detected in any other suitable manner in other embodiments (in addition or as an alternative to the use of the adjustment sensors 110.3). Thus, for example, the control signals for the respective one relative situation control actuator 110.2 can be detected and stored without gaps in a history starting from the first initial state and the adjustment information VI can be determined from this history of the control signals.

In certain embodiments, the control device 109 can additionally or alternatively also use a state change model CM of the supporting device 113 to ascertain the relative situation change information RSCI, wherein the state change model CM can be time-dependent for example (for example, in order to map ageing processes within the supporting device 113). Here, the state change model CM describes an (for example time-dependent) relative situation change behavior of the supporting device 113. In the present example, the state change model can be a creep model CM of the supporting spring device 113, wherein the creep model CM of the supporting spring device 113 describes the creep behavior of the supporting spring device 113. The relative situation change information RSCI can then be ascertained from this relative situation change behavior or creep behavior known with sufficient accuracy, possibly without a further sensor system. In further embodiments the state change model or creep model CM can also be used for checking the plausibility of the relative situation change information RSCI, which was determined in another way, such as is described above or below.

In certain embodiments, the control device 109 can optionally also include an imaging error detection device (not illustrated in more detail here), which produces at least one imaging error information IEI, which is representative for an imaging error of the imaging device. The control device 109 then derives the relative situation change information RSCI from the imaging error information IEI, for example on the basis of a change in the imaging error information item IEI over time. These embodiments use a known relationship between the imaging error of the imaging device and the change in static relative situation between the first supporting structure 111.1 and the second supporting structure 111.2 caused by creep or settling effects. Thus, certain changes in relative situation can cause characteristic imaging errors, which consequently have a characteristic fingerprint, which was determined in advance from theory and/or by simulation. These characteristic imaging errors or fingerprints can then be used to deduce an actual change in relative situation in the control device 109 during operation.

A relatively clear relationship between the imaging error and such a change in relative situation arises, for example, in the case of embodiments in which the optical imaging device 101 further includes passive optical components which are involved with the imaging but not actively adjusted by way of the relative situation control device 110, but instead are connected in a substantially rigid fashion with the first supporting structure 111.1 during operation, as is indicated in FIG. 1 by the contour 107.3, which represents a stop. In this case, only the actively adjusted optical elements of the element group 107.1 are repositioned by the relative situation control device 110 to follow the change in relative situation, while the passive components, such as the stop 107.3, remain in their relative situation thus yielding a change in relative situation between the optical components 107.1 and 107.3, which is accompanied by a characteristic imaging error.

In further embodiments, the control device 109 can additionally or alternatively include a relative situation detection device, as indicated in FIG. 2 by the contour 109.4. In this case, the relative situation detection device 109.4 generates at least one relative situation information RSI which is representative for the relative situation between the first supporting structure 111.1 and the second supporting structure 111.2 in at least one degree of freedom, the information being output to the control unit 109.2. The control device 109 then derives the relative situation change information RSCI from the relative situation information RSI, for example on the basis of a change in the relative situation information RSI over time. In this way, it is possible to realize relatively simple and precise detection of the relative situation change information RSCI.

It should be mentioned again at this point that the embodiments described above or below for determining the relative situation change information RSCI can be combined in any manner as a matter of principle, for example in order to obtain consolidated (e.g., averaged) relative situation change information RSCI. In addition or as an alternative thereto, individual embodiments for determining the relative situation change information RSCI can naturally also be used to check the plausibility of the results of the other embodiments for determining the relative situation change information RSCI.

In general, replacing the first target state S1 by the second target state S2 can be implemented at any suitable points in time or triggered by any temporal events (e.g., specifiable intervals) and/or non-temporal events (e.g., detected shock loads, reaching a certain number of imaging procedures, starting up or shutting down the imaging device 101, etc.).

In the present example, the control device 109 activates the compensation mode or creep compensation mode CCM if the relative situation change represented by the relative situation change information RSCI exceeds a specifiable limit value LIM (i.e., if the following applies: RSCI>LIM). As a result of this, it is naturally possible to react relatively efficiently and in needs-based fashion to the creep or settling effects.

Additionally or alternatively, the control device 109 can activate the compensation mode CCM, as mentioned, on the basis of specifiable events, for example at specifiable time intervals, wherein the compensation mode is activated, for example, 0.25 to 10 years (e.g., 0.5 to 5 years, 1 to 2 years) following first operation of the imaging device 101 and/or a preceding activation of the compensation mode CCM.

In general, the control device 109 can be designed in any suitable manner in order to realize a control of the relative situation control device 110 that is adapted to the respective optical imaging process of the imaging device 101. It is possible to provide any suitable control bandwidths for controlling the relative situation control device 110. In some embodiments, the control device 109 has a control bandwidth of 10 Hz to 1000 Hz (e.g., 20 Hz to 500 Hz, 50 Hz to 300 Hz).

The degree of freedom or the degrees of freedom DOF in which there is a change in relative situation relevant to the imaging process or the imaging errors thereof as a result of creep or settling effects can be any degrees of freedom, up to all six degrees of freedom in space. Here, any suitable limit values can be specified, which, if exceeded, involve or prompt a replacement of the previous target state S1 by the corrected target state S2.

In certain embodiments, the at least one degree of freedom DOF of the change in relative situation is a rotational degree of freedom, for example a rotational degree of freedom about a tilt axis extending transversely to the direction of gravity. The specifiable limit value then can be representative for a deviation of the relative situation between the first supporting structure 111.1 and the second supporting structure 111.2 from a specifiable relative target situation by 1 μrad to 500 μrad (e.g., 10 μrad to 300 μrad, 20 μrad to μrad). In addition or as an alternative thereto, the at least one degree of freedom DOF of the change in relative situation can be a translational degree of freedom, for example, a translational degree of freedom along the direction of gravity. The specifiable limit value then can be representative for a deviation of the relative situation between the first supporting structure 111.1 and the second supporting structure 111.2 from a specifiable relative target situation by 1 μm to 500 μm (e.g., 10 μm to 300 μm, 20 μm to 100 μm).

Figure 5:
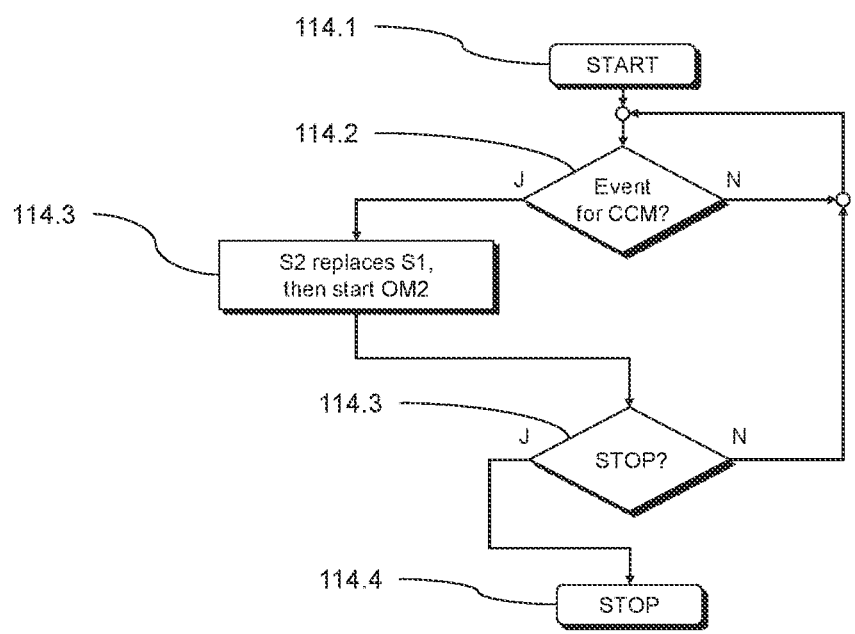
FIG. 5 is a flowchart of an embodiment of a method according to the disclosure, which can be carried out using the imaging device from FIG. 1.

Using the designs described above, it is possible to perform the method according to the disclosure as described above. Here, as shown in FIG. 5, the procedure is initially started in a step 114.1. By way of example, this happens when the imaging device 101 is started up for the first time.

Then, in a step 114.2, a check is carried out within the control device 109 as to whether one of the above-described events has occurred, which triggers the activation of the creep compensation mode CCM. This check is repeated if this is not the case. However, if this is the case, the second target state S2 is ascertained in the manner described above in the control device 109 within a step 114.3. Then, the second target state S2 is used instead of the first target state S1 (and consequently as the new first target state S1) in the control device 109, wherein the control device 109 then puts the imaging device into the second operating state OM2 (which then replaces the first operating state). Then, in a step 114.3, a check is carried out in the control device 109 as to whether the procedure should be terminated. If not, there is a jump back to the step 114.2. Otherwise, the procedure is terminated in a step 114.4. Apart from that, reference is made to the explanations above with respect to further details of the method so as to avoid repetition.

In the foregoing, the present disclosure was only described on the basis of examples in which the relative situation of each of the optical elements of the element group 107.1 was actively adjusted in relation to the central reference 112. However, it is understood that in other embodiments only some of the optical elements (possibly even only one optical element) of the element group 107.1 can also be actively adjusted directly in relation to the central reference 112 while the remaining optical elements of the element group 107.1 are actively adjusted relative to one of these optical elements that has been actively adjusted with respect to the central reference 112. For example, only one of the optical elements of the element group 107.1 can serve as a reference element and can be directly actively adjusted with respect to the central reference 112, while all other optical elements of the element group 107.1 are actively adjusted relative to this reference element (and hence only indirectly with respect to the central reference 112).

The present disclosure has been described above exclusively on the basis of examples from the area of microlithography. However, it is understood that the disclosure can also be used in the context of any other optical applications, for example imaging methods at different wavelengths, in which similar problems arise with respect to the support of heavy optical units.

Furthermore, the disclosure can be used in connection with the inspection of objects, such as for example so-called mask inspection, in which the masks used for microlithography are inspected for their integrity, etc. In FIG. 1, a sensor unit, for example, which detects the imaging of the projection pattern of the mask 104.1 (for further processing), then takes the place of the substrate 105.1. This mask inspection can then take place substantially at the same wavelength as is used in the later microlithographic process. However, it is similarly possible also to use any desired wavelengths deviating therefrom for the inspection.

The present disclosure has been described above on the basis of specific exemplary embodiments showing specific combinations of the features. It should expressly be pointed out at this juncture that the subject matter of the present disclosure is not restricted to these combinations of features, rather all other combinations of features such as are evident from the following patent claims also belong to the subject matter of the present disclosure.

What is claimed is:

1. An arrangement, comprising:
   an optical element;
   a control device comprising an active relative situation control device;
   a supporting device;
   a first supporting structure;
   a second supporting structure; and
   a measuring device,
   wherein:
      the first supporting structure supports the optical element via the active relative situation control device;
      the first supporting structure supports the second supporting structure via the supporting device;
      the second supporting structure supports the measuring device via the control device;
      the measuring device is configured to output measurement information to the active relative situation control device;
      the measurement information is representative of a position and/or an orientation of the optical element in relation to a reference in at least one degree of freedom in space;
      in a first mode, the active relative situation control device is configured to adjust, based on the measurement information, a first target state of the position and/or the orientation of the optical element in relation to the reference in the at least one degree of freedom;
      the control device is configured to detect relative situation change information representative of a change in a static relative situation between the first and second supporting structures in at least one degree of freedom;
      in a compensation mode, the control device is configured to set, based on the relative situation change information, a second target state of the position and/or the orientation of the optical element in relation to the reference of the active relative situation control device to compensate the change in the static relative situation;
      in a second mode, the control device is configured to use the second target state instead of the first target state; and
      the arrangement is an arrangement of a microlithographic optical imaging device.

2. The arrangement of claim 1, wherein:
   the active relative situation control device has an initial first state in which the optical element is in the first target state;
   in the second mode, the active relative situation control device has a second initial state in which the optical element is at least substantially in the second target state; and
   the second initial state at least substantially corresponds to the first initial state.

3. The arrangement of claim 2, wherein:
   the active relative situation control device comprises a deflection detection device configured to detect deflection information representative of a deflection of the optical element from the first initial state in relation to the first supporting structure in at least one degree of freedom; and
   the control device is configured to derive the relative situation change information from the deflection information.

4. The arrangement of claim 3, wherein:
   the active relative situation control device comprises a relative situation control actuator to actively adjust the optical element;
   the arrangement further comprises a deflection detection device configured to detect adjustment information representative of an adjustment of the relative situation control actuator from the first initial state; and
   the control device is configured to derive the relative situation change information from the adjustment information.

5. The arrangement of claim 4, wherein:
   the deflection detection device comprises an adjustment sensor assigned to the relative situation control actuator;
   the adjustment sensor is configured to output adjustment sensor information representative of the positioning movement of the relative situation control actuator; and
   the control device is configured to derive the adjustment information from the adjustment sensor information.

6. The arrangement of claim 1, wherein:
   the control device is configured to use a state change model of the supporting device to ascertain the relative situation change information; and
   the state change model of the supporting device describes a relative situation change behavior.

7. The arrangement of claim 1, wherein:
   the control device comprises an imaging error detection device configured to generate an imaging error information representative of an imaging error of the imaging device; and the control device is configured to derive the relative situation change information from the imaging error information.

8. The arrangement of claim 1, wherein:
the control device comprises a relative situation detection device configured to generate relative situation information representative of the relative situation between the first and second supporting structures in at least one degree of freedom; and
the control device is configured to derive the relative situation change information from the relative situation information.

9. The arrangement of claim 1, wherein at least one of the following holds:
the control device is configured to activate the compensation mode when the change in relative situation represented by the relative situation change information exceeds a limit value; and
the control device is configured to activate the compensation mode based on specifiable events.

10. The arrangement of claim 9, wherein at least one of the following holds:
the control device has a control bandwidth of 10 Hz to 1000 Hz;
the at least one degree of freedom of the change in relative situation is a rotational degree of freedom, and the limit value is representative of a deviation of the relative situation between the first and second supporting structures from a target by from one μrad to 500 μrad; and
the at least one degree of freedom of the change in relative situation is a translational degree of freedom, and the specifiable limit value is representative of a deviation of the relative situation between the first and second supporting structures from a target by from one μm to 500 μm.

11. The arrangement of claim 1, further comprising a vibration decoupling device which comprises a plurality of supporting spring devices,
wherein:
the first supporting structure supports the second supporting structure via the plurality of supporting spring devices;
the supporting spring devices act kinematically parallel to one another between the first and second supporting structures;
for each supporting spring device, the supporting spring device defines a supporting force direction along which it exerts a supporting force between the first and second supporting structures;
for each supporting spring device, the supporting spring device defines a supporting length along the supporting force direction of the supporting spring device;
the change in relative situation is caused by a change in length of a supporting spring device along its supporting force direction; and
the change in length of the supporting spring device is due to a creep process of the supporting spring device.

12. An optical imaging device, comprising:
an illumination device comprising a first optical element group; and
a projection device comprising a second optical element group,
wherein:
the illumination device is configured to illuminate an object;
the projection device is configured to project an image of the object onto a substrate; and
at least one member selected from the group consisting of the illumination device and the projection device comprises an arrangement according to claim 1.

13. A method of using a microlithographic optical imaging device comprising an illumination device and a projection device, the illumination device comprising a first optical element group, and the projection device comprising a second optical element group, the method comprising:
using the illumination device to illuminate an object; and
using the projection device to project an image of the object onto a substrate,
wherein at least one member selected from the group consisting of the illumination device and the projection device comprises an arrangement according to claim 1.

14. A method of operating a microlithographic optical imaging device comprising a first supporting structure supporting a second supporting structure via a supporting device, the first supporting structure supporting an optical element of the imaging device via an active relative situation control device of a control device, the second supporting structure supporting a measuring device of the control device, the measuring device configured to output to the relative situation control device measurement information representative of a position and/or an orientation of the optical element in relation to a reference in at least one degree of freedom in space, the relative situation control device is configured so that in a first mode of operation the control device adjusts a first target state of the position and/or the orientation of the at least one optical element in relation to the reference in the at least one degree of freedom based on the measurement information, the method comprising:
a) detecting relative situation change information representative of a change in a static relative situation between the first and second supporting structures;
b) to compensate the change in relative situation based on the relative situation change information, setting for the active relative situation control device a second target state of the position and/or the orientation of the optical element in relation to the reference; and
c) after b), in a second mode of the controller, using the second target state instead of the first target state.

15. The method of claim 14, wherein:
the relative situation control device has an adjusted first initial state in which the optical element is in the first target state;
in the second mode, the relative situation control device has a second initial state in which the optical element is at least substantially in the second target state; and
the second initial state at least substantially corresponds to the first initial state.

16. The method of claim 15, further comprising:
detecting deflection information representative of a deflection of the optical element from the first initial state in relation to the first supporting structure in at least one degree of freedom; and
deriving the relative situation change information from the deflection information.

17. The method of claim 16, further comprising:
using the relative situation control device to actively adjust the optical element via a relative situation control actuator;
detecting adjustment information representative of an adjustment of the relative situation control actuator from the first initial state; and deriving the relative situation change information from the adjustment information.

18. The method of claim 17, further comprising:
assigning an adjustment sensor to the relative situation control actuator;
outputting, from the adjustment sensor, adjustment sensor information representative of the positioning movement of the relative situation control actuator; and
deriving the adjustment information is derived from the adjustment sensor information.

19. The method of claim 14, further comprising using a state change model of the supporting device to ascertain the relative situation change information, wherein the state change model of the supporting device describes a relative situation change behavior of the supporting device.

20. The method of claim 14, further comprising:
generating an imaging error information item representative for an imaging error of the imaging device; and
deriving the relative situation change information from the imaging error information.

* * * * *